United States Patent
Ong et al.

[19]

[11] Patent Number: 5,850,368
[45] Date of Patent: *Dec. 15, 1998

[54] BURST EDO MEMORY ADDRESS COUNTER

[75] Inventors: Adrian E. Ong, San Jose, Calif.; Paul S. Zagar, Woodinville, Wash.; Brett L. Williams, Eagle; Troy A. Manning, Meridian, both of Id.

[73] Assignee: Micron Technology, Inc., Boise, Id.

[*] Notice: The term of this patent shall not extend beyond the expiration date of Pat. No. 5,675,549.

[21] Appl. No.: 922,194

[22] Filed: Sep. 2, 1997

Related U.S. Application Data

[63] Continuation of Ser. No. 457,651, Jun. 1, 1995, Pat. No. 5,675,549.

[51] Int. Cl.$^6$ ................................................. G11C 8/00
[52] U.S. Cl. .................................... 365/238.5; 365/236
[58] Field of Search .......................... 365/238.5, 236, 365/235, 230.08

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,847,758 | 7/1989 | Olson et al. | 365/238.5 |
| 4,870,622 | 9/1989 | Aria et al. | 365/230 |
| 4,875,192 | 10/1989 | Matsumoto | 365/193 |
| 4,933,910 | 6/1990 | Olson et al. | 365/238.5 |
| 5,058,066 | 10/1991 | Yu | 365/189.05 |
| 5,126,975 | 6/1992 | Handy et al. | 365/230 |
| 5,267,200 | 11/1993 | Tobita | 365/189 |
| 5,268,865 | 12/1993 | Takasugi et al. | 365/189.05 |
| 5,280,594 | 1/1994 | Young et al. | 711/157 |

(List continued on next page.)

FOREIGN PATENT DOCUMENTS 19507562  9/1995  Germany .

OTHER PUBLICATIONS

"DRAM 1 Megx4 DRAM 5VEDO Page Mode",, *1995 Dram Data Book,,* pp. 1–1 thru 1–30,, (Micron Technology, I).

"Rossini, Pentium, PCI–ISA, Chip Set", *Symphony Laboratories,,* entire book.

"DRAM 1991", *Toshiba America Electronic Components, Inc.,* pp. A–137–A–159.

"Application Specific DRAM", *Toshiba America Electronic Components, Inc.,* C178, C–260, C 218, (1994).

"Burst DRAM Function & Pinout", *Oki Electric Ind., Co., Ltd., 2nd Presentation, Item 619,* (Sep. 1994).

(List continued on next page.)

*Primary Examiner*—Tan T. Nguyen
*Attorney, Agent, or Firm*—Schwegman, Lundberg, Woessner & Kluth, P.A.

[57] ABSTRACT

A counter comprised of two flip flops and a multiplexer produces a sequential or interleaved address sequence. The addresses produced are used to access memory elements in a Burst Extended Data Output Dynamic Random Access Memory (Burst EDO or BEDO DRAM). Input addresses in combination with a sequence select signal are logically combined to produce a multiplexer select input which selects between true and compliment outputs of a first flip flop to couple to an input of a second flip flop to specify a toggle condition for the second flip flop. Outputs of the counter are compared with outputs of an input address latch to detect the end of a burst sequence and initialize the device for another burst access. A transition of the Read/Write control line during a burst access will terminate the burst access and initialize the device for another burst access.

17 Claims, 12 Drawing Sheets

U.S. PATENT DOCUMENTS

| | | | |
|---|---|---|---|
| 5,305,284 | 4/1994 | Iwase | 365/238.5 |
| 5,325,330 | 6/1994 | Morgan | 365/189.05 |
| 5,325,502 | 6/1994 | McLaury et al. | 365/425 |
| 5,335,336 | 8/1994 | Kametani | 365/238.5 |
| 5,349,566 | 9/1994 | Merritt et al. | 365/233.5 |
| 5,357,469 | 10/1994 | Sommer et al. | 365/193 |
| 5,363,330 | 11/1994 | Kobayashi et al. | 365/238.5 |
| 5,373,227 | 12/1994 | Keeth | 323/313 |
| 5,379,261 | 1/1995 | Jones, Jr. | 365/230 |
| 5,392,239 | 2/1995 | Margulis et al | 365/189 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,526,320 | 6/1996 | Zagar et al. | 365/233.5 |
| 5,675,549 | 10/1997 | Ong et al. | 365/233.5 |

OTHER PUBLICATIONS

"Hyper page mode DRAM", *8029 Electronic Engineering 66, No. 813,* Woolwich London GB, pp. 47–48, (Sep. 1994).

"Micron Semiconductor, Inc.", *1994 DRAM Data Book, entire book* .

"Mosel–Vitelic V53C8257H DRAM Specification Shhet, 20 pages, Jul. 2, 1994".

"Pipelined Burst DRAM", *Toshiba, JEDEC JC 42.3 Hawaii,* (Dec. 1994).

"Samsung Synchronous DRAM", *Samsung Electronics,* pp. 1–16, (Mar. 1993).

"Synchronous DRAM 2 MEG cx 8 SDRAM", *Micron Semiconductor, Inc.,* pp. 2–43 through 2–8.

Bursky, D., "Novel I/O Options and Innovative Architectures Let DRAMs Achieve SRAM Performances; Fast DRAMS can be swapped for SRAM Caches", *Electronics Design,* vol. 41, No. 15, Cleveland, Ohio, pp. 55–67, (Jul. 22, 1993).

Gowni, S.P. , et al., "A 9NS, 32K×9, BICMOS TTL Synchronous Cache RAM with Burst Mode Access", *IEEE,* Custom Integrated Circuits Conference, pp. 781–786, (Mar. 3, 1992).

| Burst Length | Starting Column Address $A_2$ $A_1$ $A_0$ | | | Linear | Interleave |
|---|---|---|---|---|---|
| 2 | V | V | 0 | 0-1 | 0-1 |
|   | V | V | 1 | 1-0 | 1-0 |
| 4 | V | 0 | 0 | 0-1-2-3 | 0-1-2-3 |
|   | V | 0 | 1 | 1-2-3-0 | 1-0-3-2 |
|   | V | 1 | 0 | 2-3-0-1 | 2-3-0-1 |
|   | V | 1 | 1 | 3-0-1-2 | 3-2-1-0 |
| 8 | 0 | 0 | 0 | 0-1-2-3-4-5-6-7 | 0-1-2-3-4-5-6-7 |
|   | 0 | 0 | 1 | 1-2-3-4-5-6-7-0 | 1-0-3-2-5-4-7-6 |
|   | 0 | 1 | 0 | 2-3-4-5-6-7-0-1 | 2-3-0-1-6-7-4-5 |
|   | 0 | 1 | 1 | 3-4-5-6-7-0-1-2 | 3-2-1-0-7-6-5-4 |
|   | 1 | 0 | 0 | 4-5-6-7-0-1-2-3 | 4-5-6-7-0-1-2-3 |
|   | 1 | 0 | 1 | 5-6-7-0-1-2-3-4 | 5-4-7-6-1-0-3-2 |
|   | 1 | 1 | 0 | 6-7-0-1-2-3-4-5 | 6-7-4-5-2-3-0-1 |
|   | 1 | 1 | 1 | 7-0-1-2-3-4-5-6 | 7-6-5-4-3-2-1-0 |

FIG. 2

BURST EDO MEMORY ADDRESS COUNTER

This application is a continuation of U.S. patent application Ser. No. 08/457,651, filed Jun. 1, 1995, now U.S. Pat. No. 5,675,549.

FIELD OF THE INVENTION

This invention relates to internal address generation circuits and counters for memory devices with burst access capability, and methods of accessing burst access memory devices.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) are then used to latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario with the device operating at minimum cycle times, there is no time to latch the output data external to the memory device. For devices with tCAC as low as 10 nanoseconds, the data is still only valid for a few nanoseconds. On a heavily loaded microprocessor memory bus, trying to latch an asynchronous signal that is only valid for a few nanoseconds is very difficult. Even providing a new address every 35 nanoseconds requires large address drivers which create significant amounts of electrical noise within the system.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate new memory devices such as SDRAMs will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. Internal circuitry of the memory device is largely compatible with existing Extended Data Out (EDO) DRAMs. This similarity allows the two part types to be manufactured on one die with a limited amount of additional circuitry. The ability to switch between a standard non-burst mode and a high speed burst mode allows the device to be used to replace standard devices, and eliminates the need to switch to more complex high speed memory devices. Internal address generation provides for faster data access times than is possible with either fast page mode or EDO DRAMs.

A novel counter architecture provides address generation for linear and interleaved addressing sequences. A comparator is used to detect completion of a burst access, and to prepare the device to begin additional burst accesses. The device is compatible with existing memory module designs including Single In-Line Memory Module (SIMM), Multi-Chip Module (NCM) and Dual In-Line Memory Module (DIMN) designs. This combination of features allows for significant system performance improvements with a minimum of design alterations.

BRIEF DESCRIPTION OF THE DRAWINGS

The features of the invention as well as objects and advantages will be best understood by reference to the appended claims, detailed description of particular embodiments and accompanying drawings where:

FIG. 2 is a table showing linear versus interleaved addressing formats;

DETAILED DESCRIPTION OF THE PREFERRED EMBODIMENTS

Figure 1:
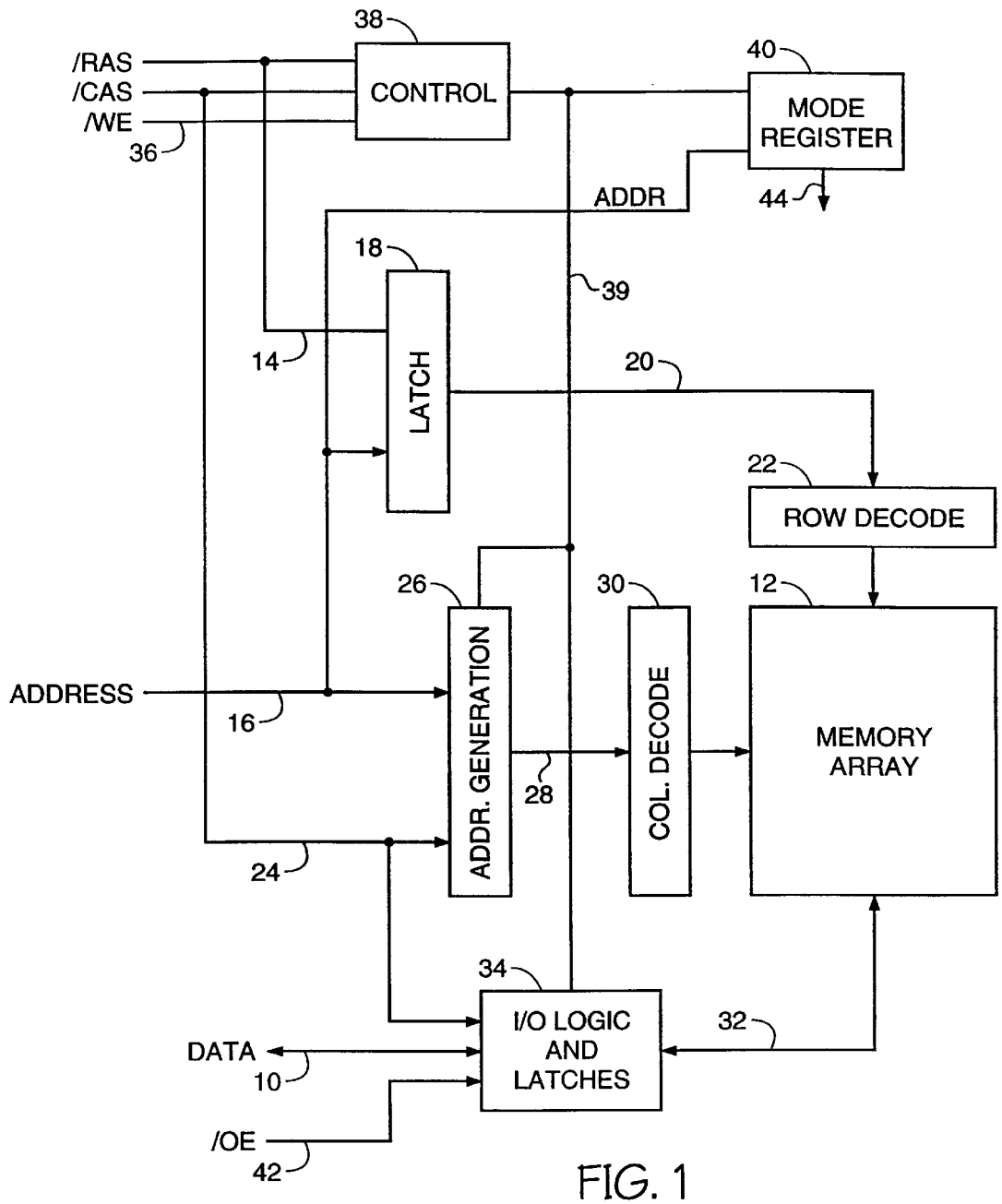
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 may have an industry standard pinout for eight bit wide EDO DRAMs. An active-low row address strobe (/RAS) signal 14 is used to latch a first portion of a multiplexed memory address, from address inputs 16, in latch 18. The latched row address 20 is decoded in row decoder 22. The decoded row address is used to select a row of the memory array 12. A column address strobe (/CAS) signal 24 is used to latch a second portion of a memory address from address inputs 16 into address generation circuit 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 will continue to drive the data lines without tri-stating the data outputs during /CAS high intervals dependent on the state of the output enable and write enable (/OE and /WE) control lines, thus allowing additional time for the system to latch the output data. The data outputs remain valid throughout the burst read cycles with the exception of brief periods of data transition. During these periods of data transition, the output drivers may be turned off momentarily in order to aid data transition. This state of the output buffer should not be confused with the standard DRAM tri-state condition which is intended to release the data bus.

Once a row and a column address are selected, additional transitions of the /CAS signal are used to advance the column address within the address generation circuit in a predetermined sequence. The time at which data will be valid at the outputs of the burst EDO DRAM is dependent only on the timing of the /CAS signal provided that /OE is maintained low, anid /WE remains high. The output data signal levels may be but are not limited to being driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2,4 and 8 cycles. The "V" for starting addresses A1 and A2 in the table represent address values that remain unaltered through the burst sequence. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

In the burst access memory device, each new column address from the address generation circuit is decoded and is used to access additional data within the memory array without the requirement of additional column addresses being specified on the address inputs 16. This burst sequence of data will continue for each /CAS falling edge until a predetermined number of data accesses equal to the burst length has occurred. A /CAS falling edge received after the last burst address has been generated will latch another column address from the address inputs 16 and a new burst sequence will begin. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent /CAS pulse will latch a new beginning column address, and another burst read or write access will begin.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access will terminate the burst access, preventing further writes from occurring. A high to low transition on /WE within a burst read access will likewise terminate the burst read access and will place the data output 10 in a high impedance state. Transitions of the /WE signal may be locked out during critical timing periods within an access cycle in order to reduce the possibility of triggering a false write cycle. After the critical timing period the state of /WE will determine whether a burst access continues, is initiated, or is terminated. Termination of a burst access places the DRAM in a state to receive another burst access command. Both /RAS and /CAS going high during a burst access will also terminate the burst access cycle and place the data drivers in a high impedance output state. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE will transition from high to low to terminate a first burst read, and then /WE will transition back high prior to the next falling edge of /CAS in order to specify a new burst read cycle. For burst writes, /WE would transition high to terminate a current burst write access, then back low prior to the next falling edge of /CAS to initiate another burst write access. A basic implementation of the device of FIG. 1 may include a fixed burst length of 4, a fixed /CAS latency of 2 and a programmable sequence of burst addresses. This basic implementation requires very little additional circuitry to the standard EDO page mode DRAM, and may be mass produced to provide the finctions of both the standard EDO page mode and burst EDO DRAMs. This device also allows for the output enable pin (/OE) to be grounded for compatibility with many SIMM module designs. When not disabled (tied to ground), /OE is an asynchronous control which will prevent data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this would typically increase the /CAS to data valid delay time and doesn't allow for the read data to be disabled prior to /RAS high without an additional /CAS low pulse which would otherwise be unnecessary. In a preferred embodiment, if /OE transitions high at any time during a read cycle the outputs will remain in a high impedance state until the next falling edge of /CAS despite firther transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. Additional input signals may be used to decode an enable for setting the address sequence. For example, a specific value received on address lines A1–A7 in a WCBR cycle is decoded to specify that the sequence mode is to be set, and the state of AO is used to specify which mode is selected. The burst length and /CAS latency for this particular embodiment are fixed. Other possible alterations in the feature sets of this DRAM include having a fixed burst mode only, selecting between standard fast page mode (non-EDO) and burst mode, and using the output enable (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

The present invention is described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of all of the various memory device organizations applicable to this invention are not necessary.

A preferred pinout for the device of FIG. 1 is identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the ICAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin fuiction alternatives include driving the burst address incrementing signal on the /OE pin since the part does not require a data output disable function on this pin. Other alternate uses of the /OE pin also allow the device to maintain the standard EDO pinout, but provide increased finctionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 3:
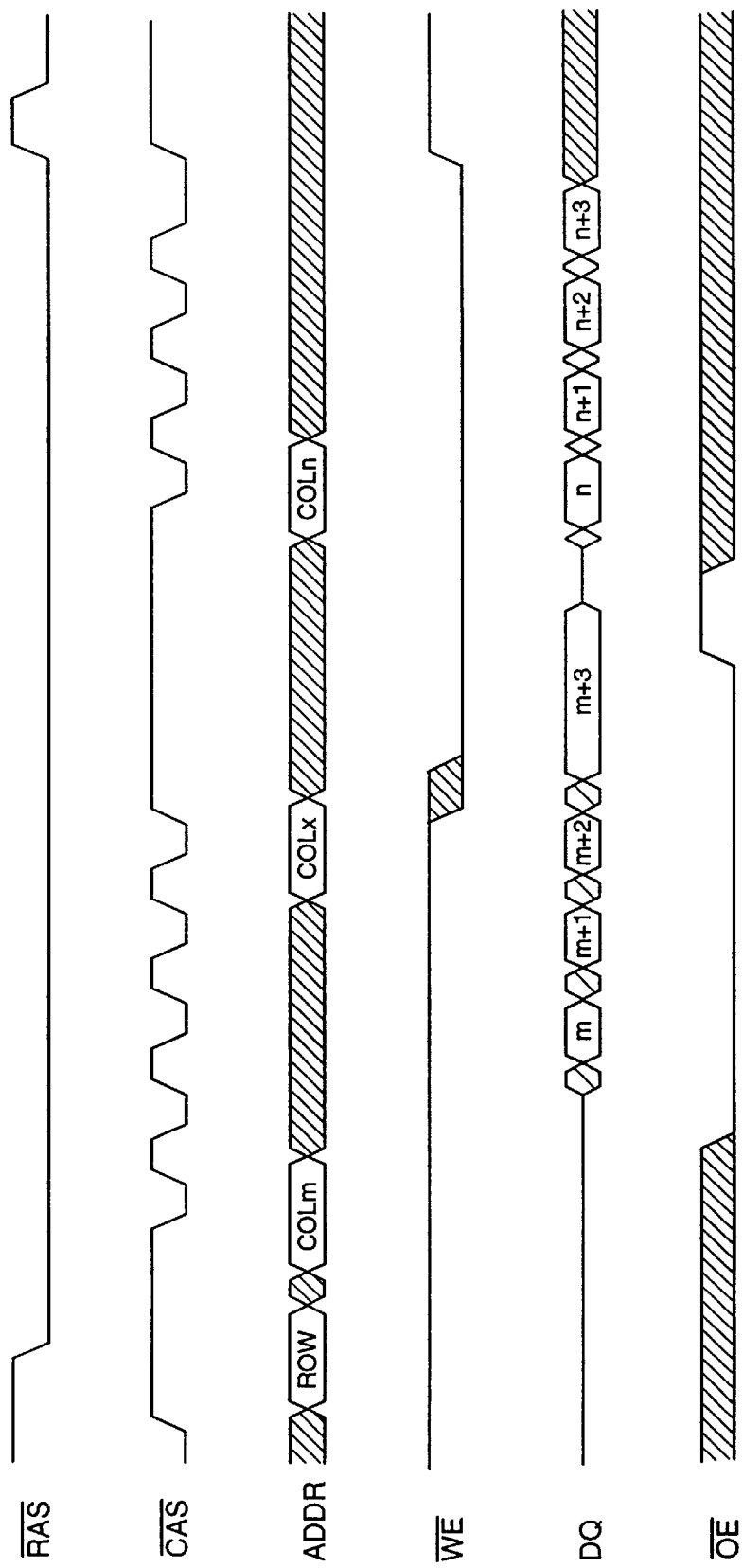
FIG. 3 is a timing diagram for a method of accessing the device of FIG. 1.

FIG. 3 is a timing diagram for performing a burst read followed by a burst write of the device of FIG. 1. In FIG. 3, a row address is latched by the /RAS signal. JWE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle. On the second falling edge of the /CAS signal, the internal address generation circuitry advances the column address and begins another access of the array, and the first data out is driven from the device after a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

Figure 4:
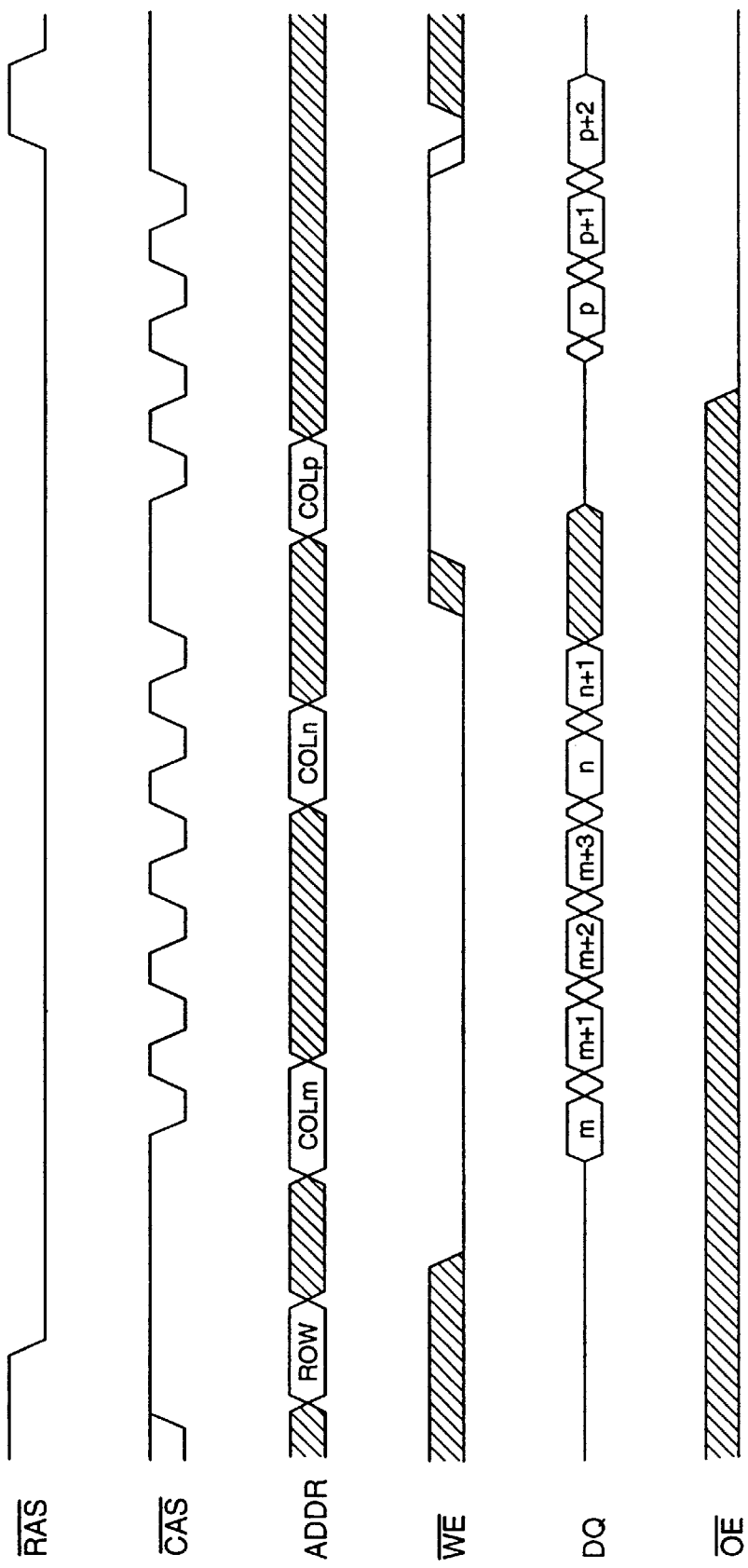
FIG. 4 is a further timing diagram for accessing the device of FIG. 1.

FIG. 4 is a timing diagram depicting burst write access cycles followed by burst read cycles. As in FIG. 3, the /RAS signal is used to latch the row address. /WE is shown as a "don't care" at the time /RAS falls for an embodiment of the present invention that does not utilize the state of /WE at /RAS time to select between burst and non-burst access modes. The first /CAS falling edge in combination with /WE low begins a burst write access with the first data being latched. Additional data values are latched with successive /CAS falling edges, and the memory address is advanced internal to the device in either an interleaved or sequential manner. On the fifth /CAS falling edge a new column address and associated write data are latched. The burst write access cycles continue until the /WE signal goes high in the sixth /CAS cycle. The transition of the /WE signal terminates the burst write access. The seventh /CAS low transition latches a new column address and begins a burst read access (/WE is high). The burst read continues until /RAS rises terminating the burst cycles.

It should be noted from Figs. 3 and 4, that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin may be grounded. Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access relative to /CAS.

Figure 5:
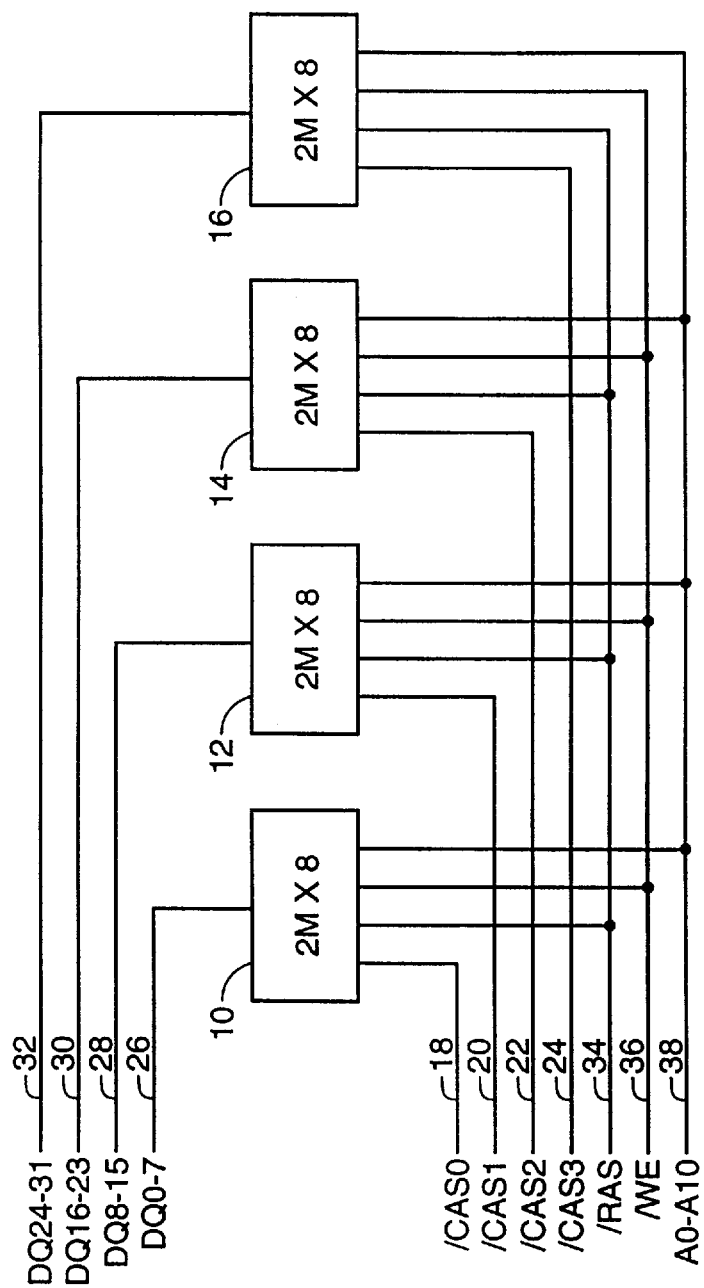
FIG. 5 is an electrical schematic diagram of a Single In-Line Memory Module in accordance with another embodiment of the invention.

FIG. 5 is a schematic representation of a single in-line memory module (SIMM) designed in accordance with the present invention. The SIMM has a standard SIMM module pinout for physical compatibility with existing systems and sockets. Functional compatibility with EDO page mode SIMMs is maintained when each of the 2 Meg×8 memory devices 10, 12, 14 and 16 are operated in an EDO page mode. Each of the /CAS signals 18, 20, 22 and 24 control one byte width of the 32 bit data bus 26, 28, 30 and 32. A /RAS 34 signal is used to latch a row address in each of the memory devices, and is optionally used in combination with /WE 36 to select between page mode and burst mode access cycles. Address signals 38 provide a multiplexed row and column address to each memory device on the SIMM. In burst mode, only active /CAS control lines are required to toggle at the operating frequency of the device, or at half the frequency if each edge of the /CAS signal is used as described above. The data lines are required to be switchable at half of the frequency of the /CAS lines or at the same frequency, and the other control and address signals switch at lower frequencies than /CAS and the data lines. As shown in FIG. 5, each /CAS signal and each data line is connected to a single memory device allowing for higher frequency switching than the other control and address signals. Each of the memory devices 10, 12, 14 and 16 is designed in accordance with the present invention allowing for a burst mode of operation providing internal address generation for sequential or interleaved data access from multiple memory address locations with timing relative to the /CAS control lines after a first row and column address are latched.

Figure 6:
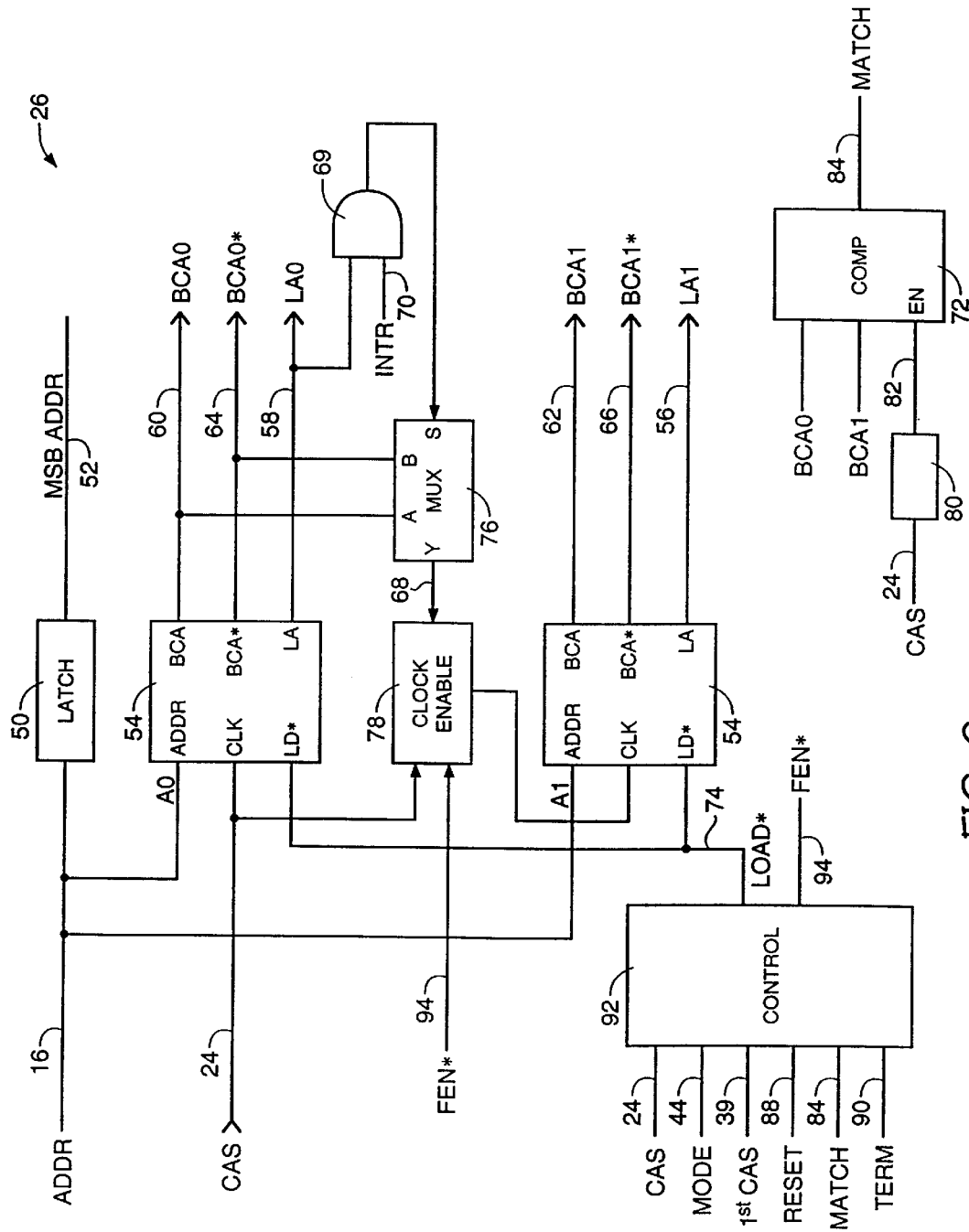
FIG. 6 is a schematic diagram of a column address generation and control circuit.

FIG. 6 is a schematic representation of the address generation circuit 26 of FIG. 1. FIG. 6 by way of example shows a two bit address generator for a Burst EDO memory device with a fixed burst length of four. Electrical signals and circuit elements in FIG. 6 which are common or derivatives of elements of FIG. 1 are labeled with the same reference numbers. As shown in FIG. 1, address 16, address strobe 24, and control 39 from control circuitry 38 provide inputs to address generation circuit 26. Mode control information 44 from the mode control register of FIG. 6 is also received by address generation circuit 26. For the two bit address generator shown, the most significant bits (MSBs) of the address are latched in latch 50 to provide the column address MSBs 52 which form a portion of address 28 of FIG. 1. The two least significant bits A0 and A1 of address 16 are each coupled to a one bit counter element 54. The two one bit counter elements together make up a two bit burst address counter. The outputs of the one bit counter elements are latched initial address bits 56 and 58, burst address bits 60 and 62 and compliments of the burst address bits 64 and 66. The latched initial address 52, 56 and 58 will reflect the initial burst address until it is overwritten with a new initial burst address. The latched initial address is used in determining when the terminal burst address has been reached. The LSB latched initial address 58 is also used to determine the toggle condition 68 for the next higher counter bit. The clock for the least significant address counter element is derived from the address strobe signal 24. The clock for the next least significant bit is derived from the address strobe signal in combination with either the true 60 or compliment 64 burst address output of the LSB counter element as selected by a logical finction, in this embodiment AND gate 69, of the addressing mode 70 and the latched initial address of the LSB counter element. This embodiment of the address generation circuit also comprises a comparator circuit 72 which compares the burst address signals with the initial latched address signals after the counter is first advanced.

In operation, a burst access command 39, a burst terminate command (write enable transition for example) on line 90, a reset condition on line 88, or a match signal on line 84, in combination with an address strobe signal, will cause an initial address to be latched in response to load signal 74 from load control circuit 92. After the initial address is latched, a burst access will be initiated. The initial address is latched in address latch 50 and in the address counter elements. Each address strobe active edge transition will cause the LSB counter element burst address outputs 60 and 64 to toggle in accordance with the addressing sequences described in FIG. 2. The second address bit will conditionally toggle in response to the address strobe dependent upon the state of the true or compliment output of the next lower order counter element. In a linear addressing mode, the second counter element will toggle as the LSB 60 toggles from a high to a low, and will maintain its state as the LSB toggles from a low to a high. In an interleaved addressing mode, the second LSB will likewise toggle as the LSB toggles from a high to a low, and will maintain its state as the LSB toggles from a low to a high, but only if the latched address LSB 58 is low (all even initial addresses). For the case of interleaved addressing from an odd (LSB high) initial address, the second LSB counter output will toggle as the LSB 60 toggles from a low to a high. As the LSB counter true output toggles from low to high, the compliment output 64 will toggle from high to low. A multiplexer 76 is used to select between the true and compliment outputs of the LSB counter to provide the toggle condition for the next counter bit. The multiplexer output is selected by logic circuit 70.

In a preferred embodiment a clock enable circuit 78 receives the toggle signal via signal line 68. It also receives the address strobe signal and provides a glitch free clock signal to the second counter element. Enable signal 94 is used to initialize or disable the clock enable circuit. An additional counter element can be added to provide addresses for burst lengths up to eight. The toggle condition of the additional stage would be dependent upon a logical combination of the previous stage latched initial address output 56 and the addressing mode in the same manner that the second stage is dependent upon the first. The initial latched address bit from the second stage in combination with the interleaved versus linear mode control determines whether the second stage true or compliment output controls the toggle condition for the third stage. For full page burst capability, the counter can be expanded without additional multiplexers for selecting toggle conditions since full page burst sequences are typically defined for linear addressing only.

The comparator is used to detect the endpoint of a burst sequence. The comparator is disabled when an initial address is loaded. After the counter is incremented, the comparator is enabled. After the terminal burst address is reached, the counter will be incremented to a value which matches the initial value. This condition results in an address match within the comparator. The match signal is coupled to the counter load control circuit and causes a new burst access initial address to be loaded, at which time the comparator is again disabled until the address is advanced.

In a preferred embodiment, memory accesses begin in response to a high to low transition of the /CAS signal, and the address counter is advanced in response to a low to high transition of /CAS. When a new burst access is begun, the address latch and counter are loaded, an access cycle is begun at the initial address and the comparator is disabled. When /CAS rises, the counter is incremented, and the comparator is enabled. Additional access cycles occur in response to successive /CAS falling edges. The /CAS rising edge following the last access of a burst cycle will cause the counter to advance and wrap around to an address which matches the initial address. The comparator will output a match signal 84 which causes a new initial burst address to be latched in response to the following /CAS falling edge. The comparator only needs to be enabled while /CAS is high, and preferably from a time delay after /CAS goes high at least until /CAS goes low. Delay circuit 80 provides the delayed /CAS signal to the comparator to enable the match signal output of the comparator.

Figure 7:
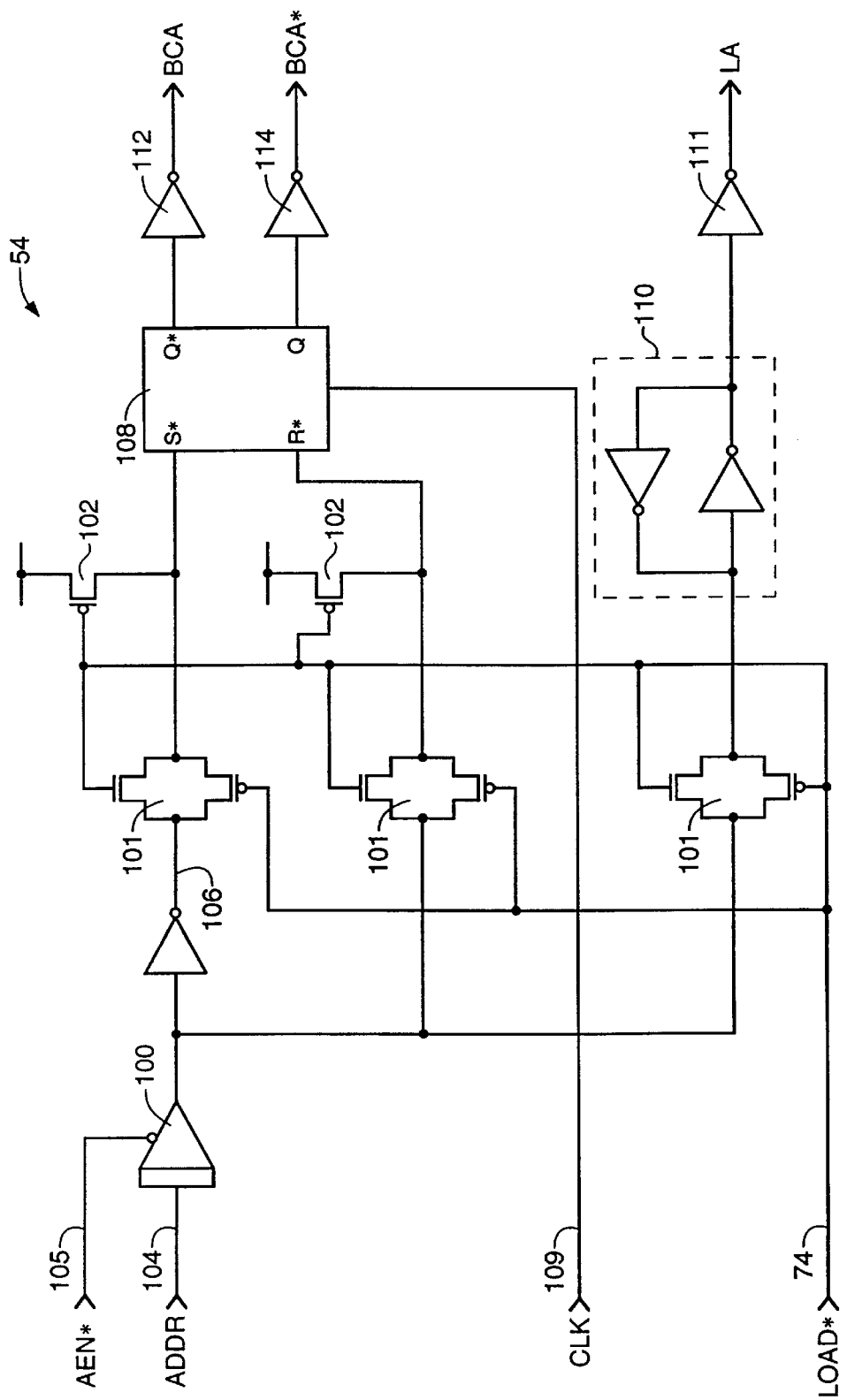
FIG. 7 is a schematic of a one bit counter element.

FIG. 7 is a schematic representation of one embodiment of the one bit counter element 54 of FIG. 6. Pass devices 101 are enabled in response to load control signal 74 from the load control circuit 92 of FIG. 6. When the pass devices are enabled, pull up devices 102 are disabled, and an address bit 104, from address bus 16 of FIG. 6, along with its compliment 106 are used to set or reset the SR flip flop 108. When the load control signal is in the inactive state (high for this embodiment), the pull up devices place the SR flip flops in a toggle flip flop configuration by pulling the set and reset inputs high with the pass devices disabled. While in the toggle flip flop configuration, the flip flop outputs will toggle with each positive transition of the input clock 109. The initial address is also latched in latch 110 and buffered out of the counter element through buffer 111. The SR flip flop outputs are also buffered by buffers 112 and 114.

Figure 8:
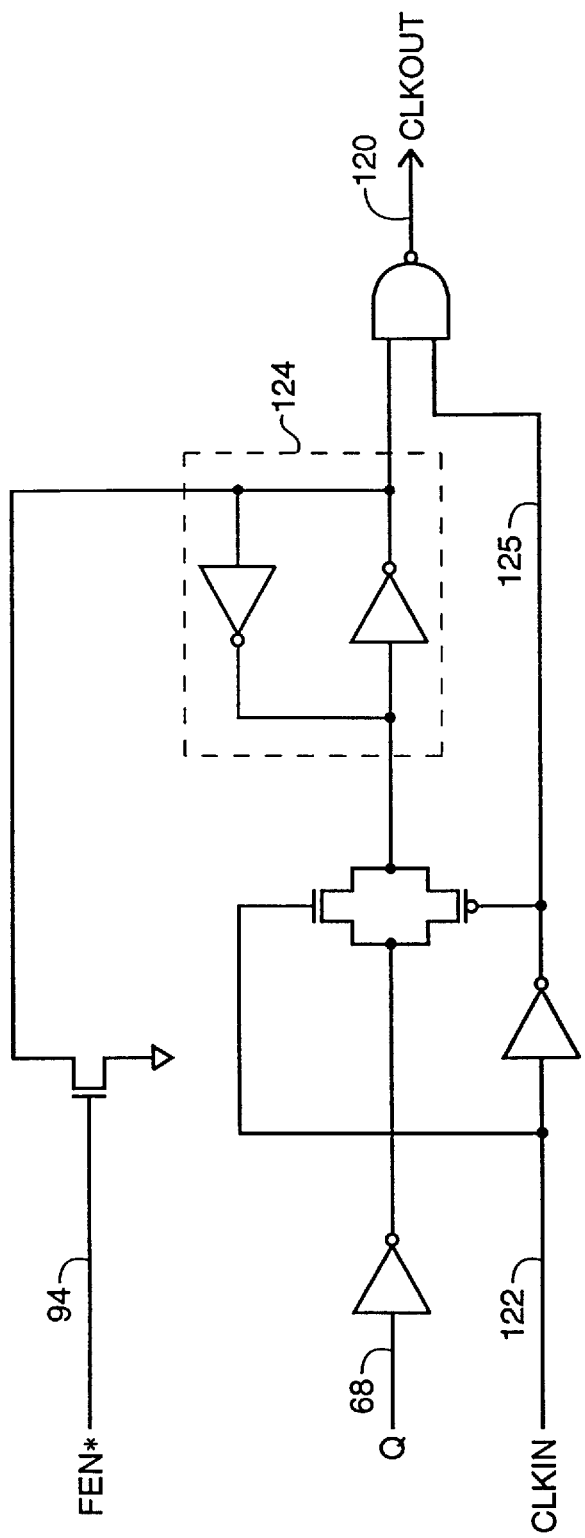
FIG. 8 is a schematic of a counter element clock enable circuit.
Figure 12:
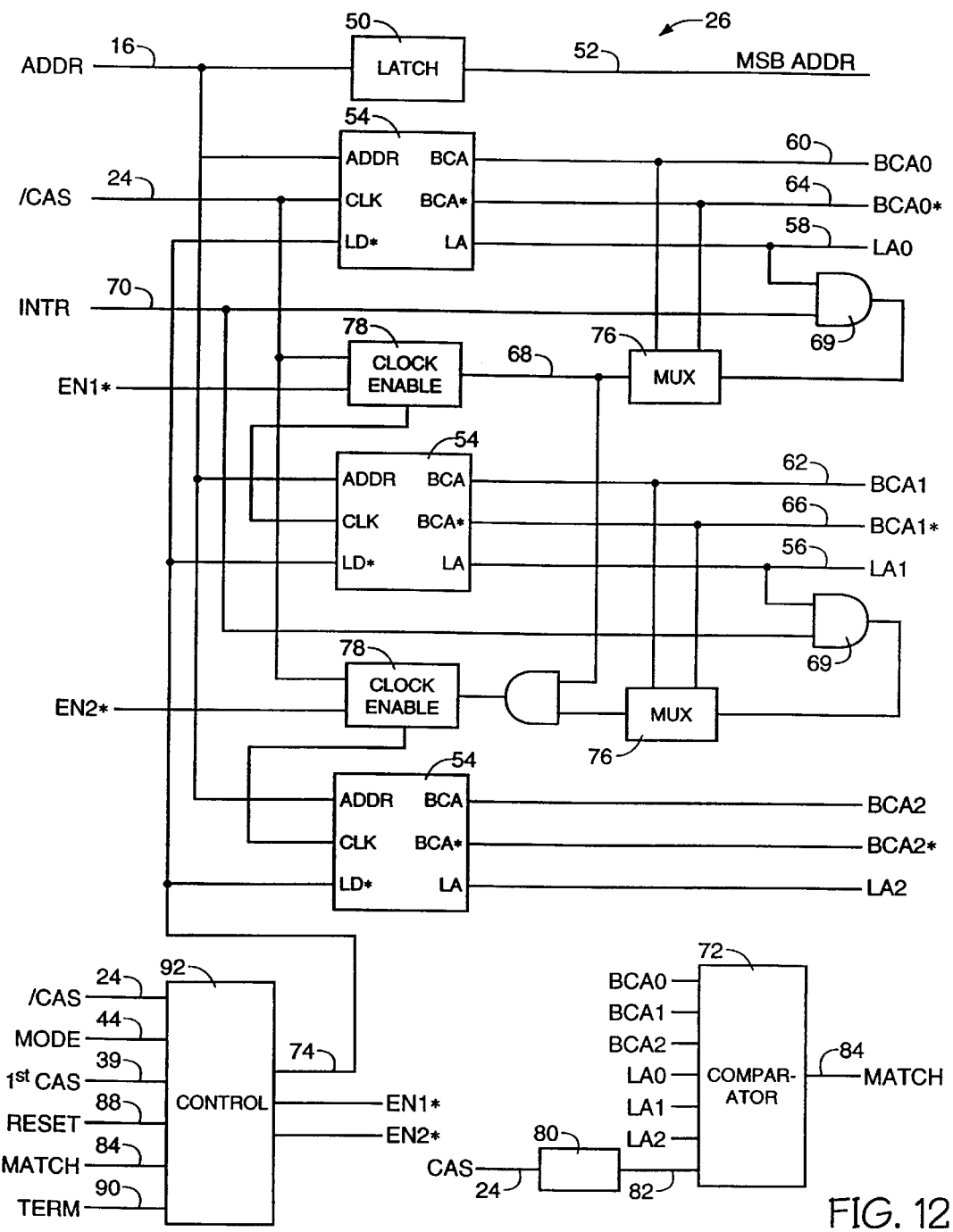
FIG. 12 is a schematic of a three bit address generator circuit.

FIG. 8 is a schematic representation of the clock enable circuit of FIG. 6. The output of the clock enable circuit 120 is a logical function of the clocking signal 122 (typically the column address strobe 24 of FIG. 6) and the toggle condition signal 68 received from the multiplexer of FIG. 6. It is desired to provide a glitch free clock signal from the clock enable circuit which will clock a counter element when the clock signal rises (in synchronization with the previous counter element). When the clock signal rises, the input 68 is allowed to pass through to latch 124 and the output is forced high by signal 125. Forcing the output high prevents the output from switching in response to transitions on the input which occur after rising edges of the clock as the counter is advanced. When the input clock signal goes low, if the input 68 was high, the output of latch 124 will be latched high, and the output of the clock enable circuit will go low indicating that the next counter stage is to be clocked on the next rising edge of the clock. When the next rising clock edge occurs, the output of the clock enable circuit will be forced back high, and input 68 which is now low will pass through to hold the output high when the clock transitions back low. A clock enable circuit input for a third counter element clock input can be designed in a similar fashion where the input is a logical AND of the input 68 for the first clock enable circuit and the multiplexer output of the second counter element as shown in FIG. 12. Gating the input in this manner ensures that the input will only be high for one cycle when the next counter stage is to be toggled. Enable input 94 when high will force the clock enable circuit output to a high preventing the next counter stage from advancing. This input may be driven high for a reset condition, to disable burst mode addressing, or to control the burst length in an embodiment such as that shown in FIG. 12.

Figure 9:
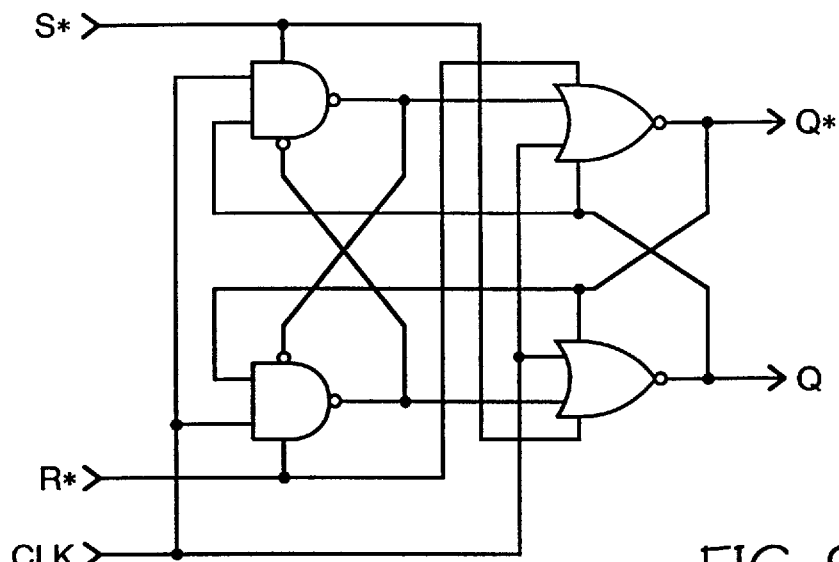
FIG. 9 is a schematic of a flip flop.
Figure 10:
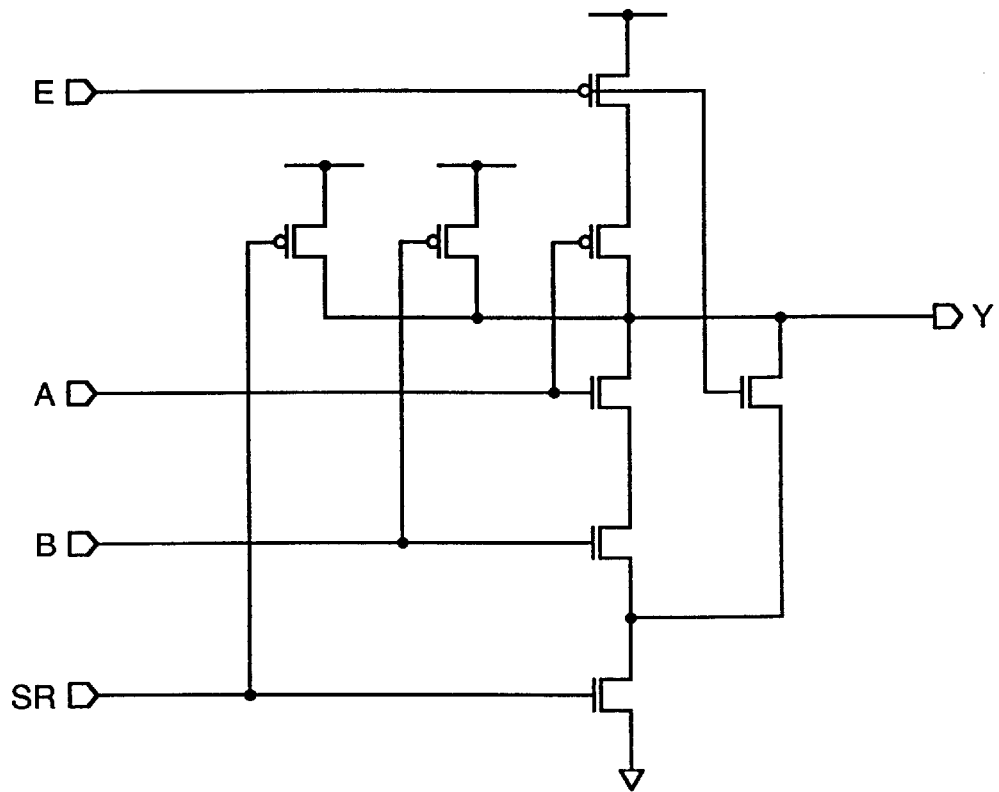
FIG. 10 is a schematic of an enable NAND gate.
Figure 11:
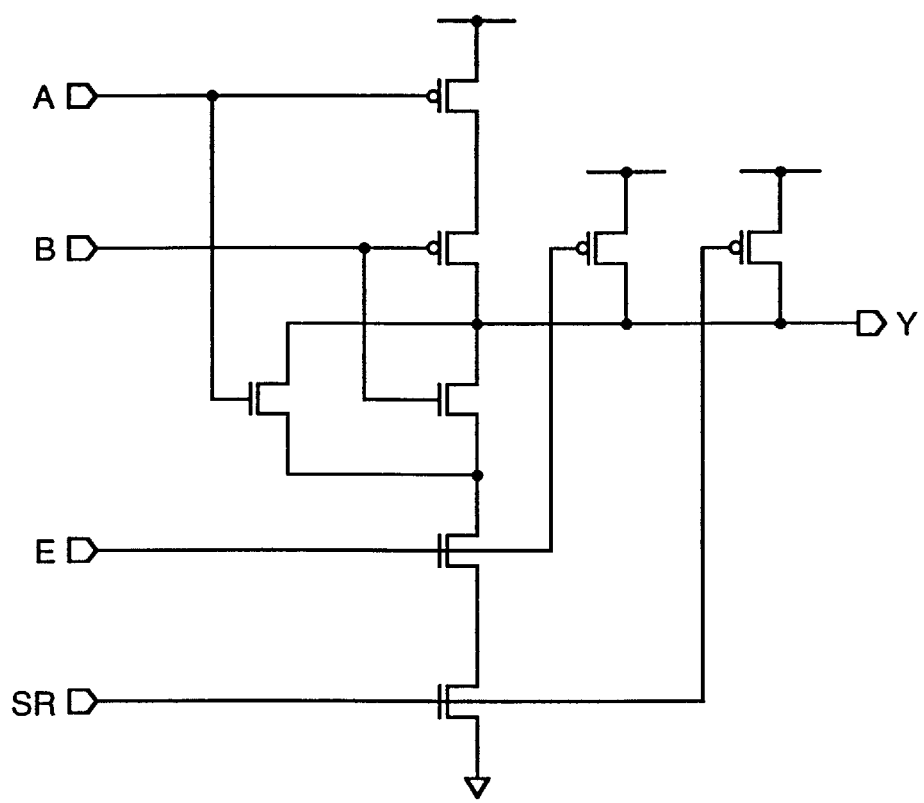
FIG. 11 is a schematic of an enable NOR gate.

FIG. 9 is a schematic diagram of one embodiment of the flip flop 108 of FIG. 7. The flip flop is comprised of two cross coupled Enable NAND gates, and two cross coupled Enable NOR gates. This embodiment of the flip flop has active low set (S*) and reset (R*) inputs, a clock input, a true output and a compliment output. Examples of Enable NAND and Enable NOR gates are provided in FIGS. 10 and 11 respectively.

FIG. 12 is a schematic diagram of a three bit counter designed in accordance with the teachings of the present invention. Many of the elements of FIG. 12 have reference numbers which correspond to similar or identical elements found in FIG. 6. As described above, a third counter element may be added to the circuit of FIG. 6 to provide a three bit counter for linear and interleaved eight cycle burst sequences. The MSB address latch 50 is one bit narrower than the latch of FIG. 6, and the comparator 72 is one bit wider. Additional clock control may be added to individually mask the clock inputs of the second and third counter stages to provide for a programmable burst length of 2 (second and third clocks masked), 4 (third stage clock masked) and 8 (all clocks enabled). The clock masking of the second and third stages may be accomplished through independent control of the clock enable circuit enable inputs in response to burst length control 44 from mode register 40 of FIG. 1. If the higher order counter stages are prevented from advancing, the comparator will detect an address match as the LSBs wrap around, and the burst access will be terminated at the appropriate time as described in reference to the embodiment of FIG. 6.

Figure 13:
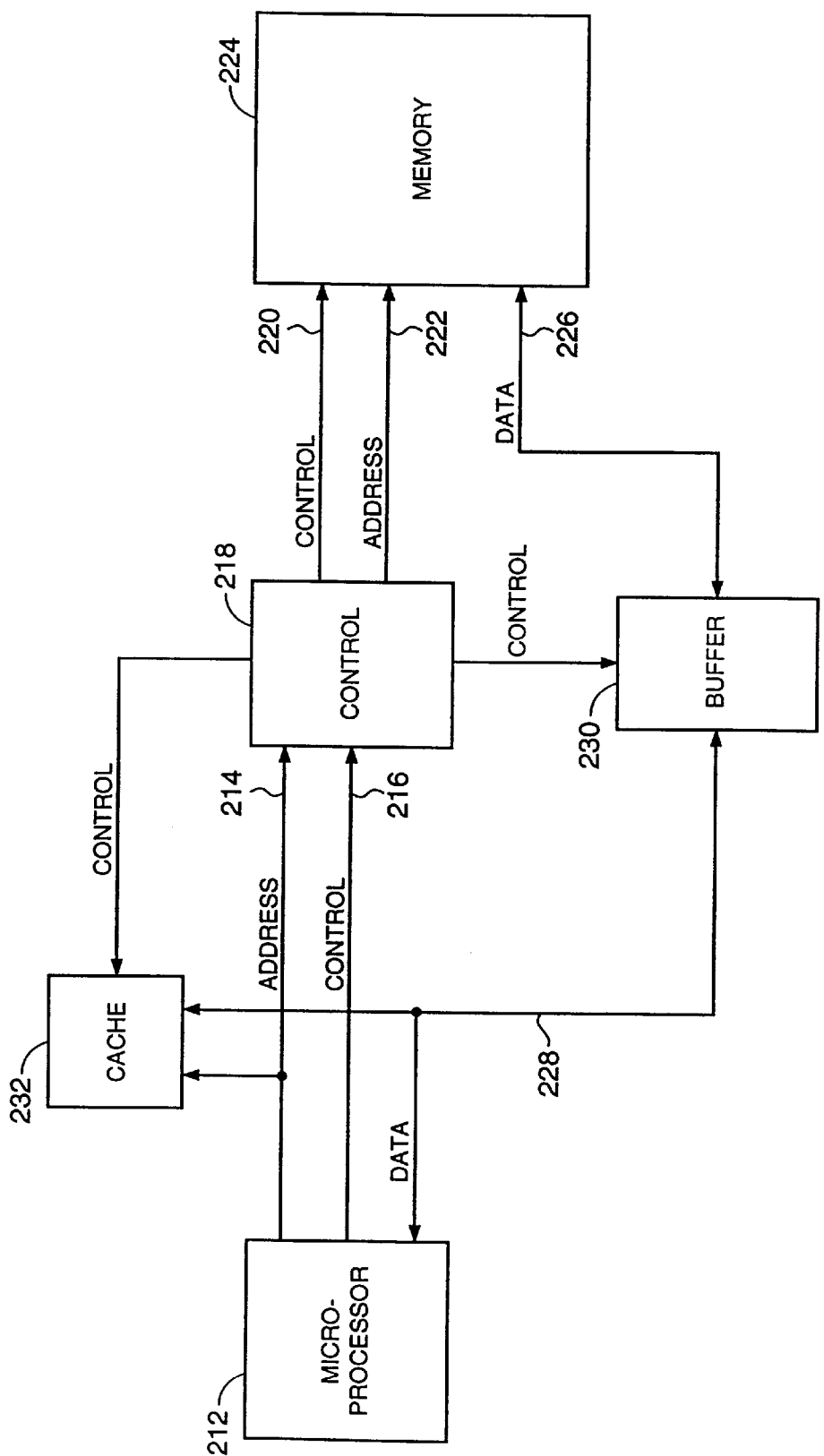
FIG. 13 is a schematic diagram of a system designed in accordance with the present invention.

FIG. 13 is a schematic representation of a data processing apparatus designed in accordance with the present invention. In FIG. 13, microprocessor 212 is connected via address lines 214 and control lines 216 to a memory control circuit 218. The memory control circuit provides address and control signals on lines 222 and 220 respectively to a burst access memory device 224. The burst access memory device sends and receives data over data bus 226. Optional data bus buffer 230 between memory data bus 226 and microprocessor data bus 228 allows for amplification of the data signals, and/or synchronization with the microprocessor and memory control signals. A fast static random access memory (SRAM) cache circuit 232 is also optional and provides higher speed access to data stored in the cache from the memory circuit or the microprocessor. Memory control circuit 218 may be incorporated within the microprocessor. The memory control circuit provides the required address strobe signals, address signals and read/write control signals required for burst mode access of the memory circuit. The capability of the processor to access the memory in a burst mode allows for the design of a computer with relatively high memory bandwidth without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast burst access of main memory in the event of a cache miss.

In operation, the microprocessor reads data from the memory device by supplying address and control signals to the memory device through the memory control circuit. In response to an initial address, a read command and an access cycle strobe, the memory device begins to access a first data word at the initial address. A second access cycle strobe advances the address within the memory device in a second access period of the burst access, and initiates a read access of data from a second address. For a latency of two, the first data is driven from the memory device after the second access cycle strobe signal occurs. Typically the first data is latched in the microprocessor in response to a third access cycle strobe which occurs at the beginning of a third access cycle period of the burst access. The third access cycle strobe also causes the second data value to be driven from the memory device. The third access cycle strobe also causes a third address to be generated within the memory device, and a third data access begins. Data is latched in the microprocessor in response to fourth, fifth and sixth access cycle strobes. In this manner four data values are received in the microprocessor in response to a single address and a plurality of access cycle strobes. The microprocessor may provide a second address to the memory device with the fifth access cycle strobe signal if the memory device is designed to perform four word burst sequences and additional data values are required from the memory. In this case, a second four word burst sequence is begun while the microprocessor is receiving data from the first four word burst. The data buffer 230 may be used to synchronize data from the memory device received in response to the access cycle strobe signal, with a system clock which is connected to the microprocessor. For write cycles, there is typically no latency. Data for write cycles is provided with each access cycle strobe signal in a burst write sequence.

In an alternate embodiment, initial burst access addresses are latched in the memory in response to falling edges of the address strobe, and additional burst addresses are generated within the memory in response to rising edges of the address strobe. The additional addresses are used to perform memory accesses in response to falling edges of the address strobe. In this manner, generation of the address for the next access cycle is begun in advance. This address may be compared with the initial address to detect an end of burst sequence condition. When the burst access is complete or terminated, a new initial address is latched in response to a falling address strobe signal.

For the purposes of this specification a microprocessor may be, but is not limited to, a microprocessor, a microcontroller, a digital signal processor, or an arithmetic processor. A signal may refer to, but is not limited to, information transferred via a conductor, or a conductor for transferring information. A node may refer to, but is not limited to, an input point, an output point, an intersection of conductors, or a point along a conductor.

While the present invention has been described with reference to preferred embodiments, numerous modifications and variations of the invention will be apparent to one of skill in the art without departing from the scope of the invention.

What is claimed is:

1. A memory device comprising a plurality of addressable memory elements, the memory device further comprising:

a two bit address generation circuit adapted to receive a first memory address in response to a transition of an address latch signal, and further adapted to generate two least significant bits in a series of memory addresses in a selectable one of a plurality of predetermined burst address sequences in response to subsequent transitions of the address latch signal, the two bit address generation circuit comprising, a latch circuit for latching most significant bits in the first memory address, two one-bit counter circuits for incrementing the two least significant bits, a control circuit for controlling the two one-bit counter circuits, and a comparator circuit for comparing the first memory address with the series of memory addresses.

2. The memory device of claim 1 wherein the two one-bit counter circuits each comprise:

an input connection for receiving a bit of the first memory address;

a flip flop circuit adapted to receive the bit of the first memory address;

pass circuitry connected to the input connection and the flip flop circuit; and a latch for latching the bit of the first memory address.

3. The memory device according to claim 1 wherein the plurality of predetermined burst address sequences comprises an interleaved address sequence and a linear address sequence, and any one of the plurality of predetermined burst address sequences may be selected for performing a burst access of the memory device.

4. The memory device according to claim 1 further comprising an address sequence select circuit electrically coupled to the two bit address generation circuit for selecting one of the plurality of predetermined burst address sequences.

5. A memory device comprising a plurality of addressable memory elements, the memory device fuirther comprising:

a three bit address generation circuit adapted to receive a first memory address in response to a transition of an address latch signal, and further adapted to generate three least significant bits in a series of memory addresses in a selectable one of a plurality of predetermined burst address sequences in response to subsequent transitions of the address latch signal, the three bit address generation circuit comprising, a latch circuit for latching most significant bits in the first memory address, three one-bit counter circuits for incrementing the three least significant bits, a control circuit for controlling the three one-bit counter circuits, and a comparator circuit for comparing the first memory address with the series of memory addresses.

6. The memory device according to claim 5 wherein the comparator terminates a burst access of the memory device in response to a match of the first input address from the address latch with an address of the series of memory addresses from the address counter.

7. The memory device according to claim 5 further comprising:

an output buffer responsive to transitions of the address latch signal to output data after a latency of at least one cycle of the address latch signal.

8. The memory device according to claim 5 further comprising:

a sequence select circuit responsive to a sequence control signal for selecting one of a plurality of predetermined address sequences.

9. The memory device according to claim 5 wherein the three one-bit counter circuits each comprise:

a first flip flop having an output;

a second flip flop having an input.

10. The memory device according to claim 9 wherein a first counter circuit comprises a multiplexer having a first input coupled to the output of the first flip flop, a second input coupled to a compliment of the output of the first flip flop, a third input coupled to the sequence select circuit and an output coupled to the input of the second flip flop.

11. A control circuit for a two bit address generation circuit used in an integrated memory device and adapted to generate two least significant bits in a series of memory addresses in a selectable one of a plurality of predetermined address sequences, comprising:

a sequence control circuit responsive to a sequence control signal for selecting one of a plurality of predetermined address sequences, the sequence control circuit is coupled to the two bit address generation circuit and an initial count register, the two bit address generation circuit generates the two least significant bits in the series of memory addresses as determined by the sequence control circuit; and a comparator coupled to an output of the two bit address generation circuit and to the initial count register, wherein the two bit address generation circuit is loaded in response to an output of the comparator indicating a match between the output of the two bit address generation circuit and a corresponding output of the initial count register.

12. A method of performing a burst access of a memory device, comprising:

loading a burst address counter with a first initial address;

accessing a first memory element at the first initial address;

advancing two least significant bits of the first initial address using the burst address counter;

accessing a second memory element at an address provided by the burst address counter;

comparing the first initial address with the address provided by the burst address counter; and terminating the burst access in response to a match of the first initial address with the address provided by the burst address counter.

13. A data processing system comprising:

a microprocessor; and a memory controller coupled to the microprocessor and a memory device;

the memory device comprising a plurality of addressable memory elements, the memory device further comprising:

an address counter adapted to receive a first memory address from the memory controller in response to a transition of an address latch signal, and further adapted to generate a series of memory addresses in a selectable one of a plurality of predetermined burst address sequences in response to subsequent transitions of the address latch signal.

14. The data processing system of claim 13, wherein:

the plurality of predetermined burst address sequences comprises an interleaved address sequence and a linear address sequence, and any one of the plurality of predetermined burst address sequences may be selected for performing a burst access of the memory device.

15. The data processing system of claim 13, further comprising:

an address sequence select circuit electrically coupled to the address counter for selecting one of the plurality of predetermined burst address sequences.

16. The data processing system of claim 15, wherein:

the address latch signal is a column address latch signal, and the address sequence select circuit is responsive to a row address latch signal to select an address sequence from the plurality of address sequences.

17. The memory device according to claim 3, further comprising:

an output buffer, electrically coupled to the memory elements, responsive to the address latch signal to output data from the memory device after a latency of at least one cycle of the address latch signal in a burst read access.

* * * * *

UNITED STATES PATENT AND TRADEMARK OFFICE
CERTIFICATE OF CORRECTION

PATENT NO. : 5,850,368
DATED : Dec. 15, 1998
INVENTOR(S) : Adrian E. Ong, et al.

It is certified that error appears in the above-identified patent and that said Letters Patent is hereby corrected as shown below:

Col. 16, line 15, after "claim", please delete"3" and insert --13--.

Signed and Sealed this

Seventh Day of December, 1999

Attest:

Attesting Officer

Q. TODD DICKINSON

Acting Commissioner of Patents and Trademarks